(12) United States Patent
Yang et al.

(10) Patent No.: US 6,352,898 B2
(45) Date of Patent: Mar. 5, 2002

(54) METHOD OF MANUFACTURING A SEMICONDUCTOR MEMORY DEVICE INCORPORATING A CAPACITOR THEREIN

(75) Inventors: Woo-Seok Yang; Deuk-Soo Pyun, both of Ichon (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/746,928

(22) Filed: Dec. 26, 2000

(30) Foreign Application Priority Data

Dec. 28, 1999 (KR) .............................. 11-63826

(51) Int. Cl.[7] .............................................. H01L 21/00
(52) U.S. Cl. ....................................... 438/298; 438/240
(58) Field of Search .......................... 438/3, 240, 396, 438/298

(56) References Cited

U.S. PATENT DOCUMENTS 5,374,578 A * 12/1994 Patel et al. ................. 438/2

2001/0013614 A1 * 8/2001 Joshi et al. ................. 257/295

* cited by examiner

*Primary Examiner*—Vu A. Le
*Assistant Examiner*—Beth E. Owens
(74) *Attorney, Agent, or Firm*—Jacobson Holman, PLLC

(57) ABSTRACT

A method for manufacturing a ferroelectric random access memory (FeRAM) device which includes the steps of preparing an active matrix provided with a transistor, diffusion regions, an isolation region, a bit line, a first insulating layer and a second insulating layer; forming a first conductive layer and then a dielectric layer on the active matrix; carrying out a rapid thermal annealing (RTA) for producing nuclei in the dielectric layer; forming a second conductive on top of the dielectric layer; carrying out a thermal annealing in a furnace; forming a capacitor structure provided with a top electrode, a capacitor thin film and a bottom electrode by patterning the second conductive, the dielectric and the first conductive layers into a first predetermined configuration; carrying out a first recovery; forming a third insulating layer on the capacitor structure and the second insulating layer; patterning the third insulating layer to form a first opening and a second opening; and carrying out a second recovery.

10 Claims, 6 Drawing Sheets

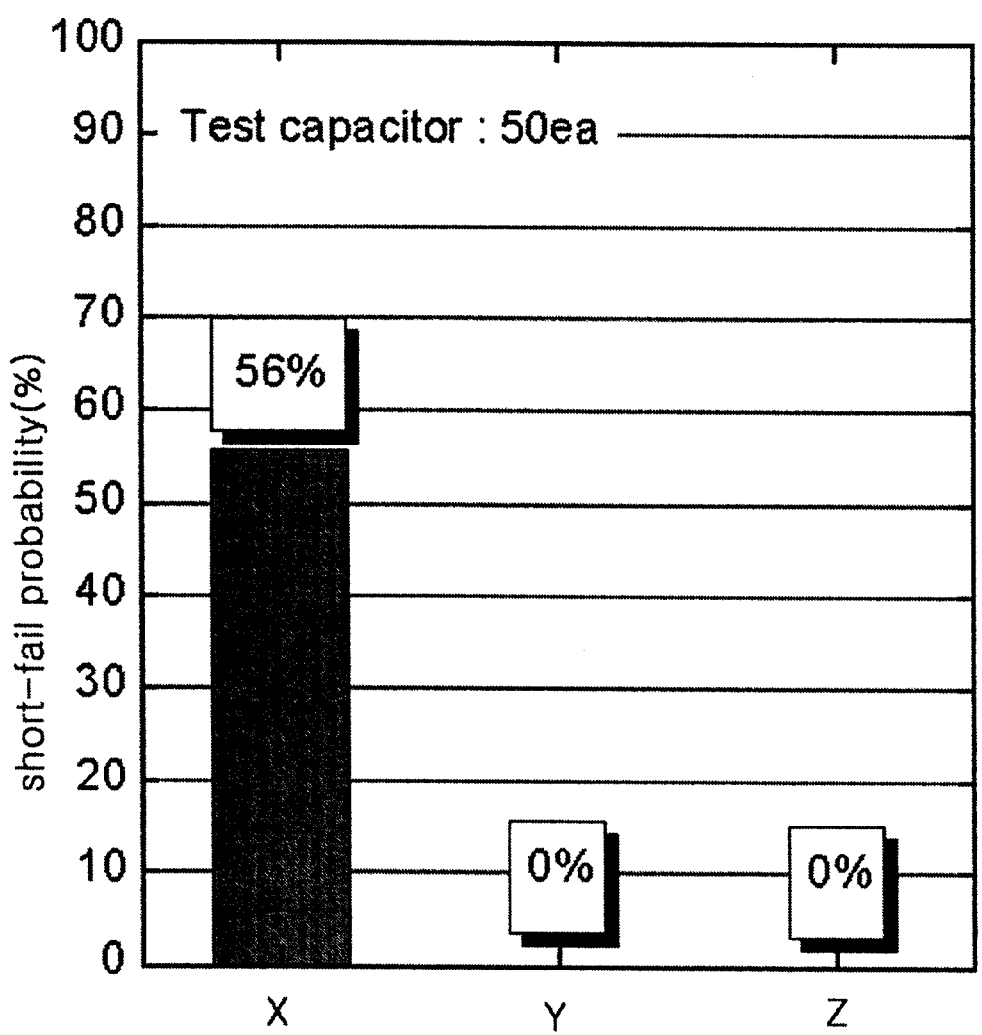

METHOD OF MANUFACTURING A SEMICONDUCTOR MEMORY DEVICE INCORPORATING A CAPACITOR THEREIN

CROSS REFERENCE TO RELATED APPLICATIONS

This patent application is related to U.S. application Ser. No. 09/467,755, now U.S. Pat. No. 6,238,934; U.S. application Ser. No. 09/605,758, filed Jun. 28, 2000 and U.S. application Ser. No. 09/867,633, filed May 31, 2001.

FIELD OF THE INVENTION

The present invention relates to a method for manufacturing a semiconductor memory device and, more particularly, to a method for manufacturing a capacitor for use in a ferroelectric random access memory (FeRAM) device with a high polarization value and improved short failure and leakage current characteristics.

DESCRIPTION OF THE PRIOR ART

With the recent progress of film deposition techniques, applications for a nonvolatile memory cell using a ferroelectric thin film have increasingly been developed. This nonvolatile memory cell is a high-speed rewritable nonvolatile memory cell utilizing the high-speed polarization/inversion and the residual polarization of the ferroelectric capacitor thin film.

Therefore, in a ferroelectric random access memory (FeRAM), a capacitor thin film with ferroelectric properties such as strontium bismuth tantalate (SBT) and lead zirconate titanate (PZT) is increasingly used in place of a conventional silicon oxide film or a silicon nitride film, because it assures a low-voltage and high-speed performance, and further, does not require periodic refresh to prevent loss of information during standby intervals like a dynamic random access memory (DRAM).

Since a ferroelectric material has a dielectric constant having a value ranging from hundreds to thousands, and stabilized residual polarization property at room temperature, such material is being applied to the nonvolatile memory device as the capacitor thin film. When employing the ferroelectric capacitor thin film in the nonvolatile memory device, information data are stored by polarization of dipoles when an electric field is applied thereto. Even if the electric field is removed, the residual polarization still remains so that the information data, i.e., 0 or 1, can be stored.

Meanwhile, to employ a ferroelectric capacitor for use in the semiconductor memory device effectively, there are several conditions required. First, a short failure should not occur; second, the ferroelectric capacitor should have a high polarization value; and third, leakage current should be minimized. The short failure and the leakage current problems may occur mainly because the ferroelectric capacitor thin film of the capacitor structure has vacancies therein or does not have a uniform thickness. Thus, if the ferroelectric capacitor thin film has a portion which is relatively thinner than another portion thereof, a short failure and/or leakage current may occur around the thinner portion. Further, the larger the grain size of the ferroelectric capacitor thin film, the higher the polarization value of the capacitor thin film.

In manufacturing the ferroelectric capacitor, there are typically two annealing steps for enhancing reliability of the ferroelectric capacitor. One annealing step is carried out in order to form a phase of the ferroelectric capacitor thin film after depositing it on a bottom electrode. In more detail, this annealing step includes a rapid thermal annealing (RTA) for producing nuclei in the ferroelectric capacitor thin film and a thermal annealing step in a furnace for growing up the grains of the ferroelectric. The second annealing step is a post thermal treatment including a first thermal treatment for recovering the ferroelectric property that has been degraded during formation of the capacitor structure by a selective etching step, and a second thermal treatment for planarizing an interlayer insulating layer formed on the capacitor structure.

Generally, the ferroelectric capacitor thin film has a smooth surface after the RTA step. However, after the thermal annealing step in the furnace, i.e., after the grains are grown up to a predetermined size, the ferroelectric capacitor thin film has a rough surface incorporating therein vacancies.

According to prior art techniques for manufacturing the ferroelectric capacitor, thermal treatments are carried out by two kinds of methods. The first method includes the steps of carrying out the RTA step for producing the nuclei, annealing in the furnace, and forming the top electrode on the ferroelectric capacitor thin film. However, using this method the ferroelectric film does not have a uniform thickness, such that vacancies may exist in the ferroelectric. Therefore, while this method has an advantage of a high polarization value when forming the top electrode on the ferroelectric capacitor thin film, short failure and leakage current may occur due to the vacancies and the varying thickness of the ferroelectric.

The second method is performed by carrying out the RTA step, forming the top electrode on the ferroelectric capacitor thin film, and carrying out the recovery step and annealing step. While this second method has a good property against the short failure and the leakage current, it has a limited capacity to grow up the grains, thereby inducing a low polarization value. When using SBT or SBTN ($Sr_xBi_y(Ta_iNb_j)_2O_9$) as the ferroelectric material, it is preferable that the post-thermal treatment for inducing a grain growth should be carried out at approximately 700° C. for a long time. But, this high temperature thermal treatment may also create a problem by producing the vacancies and shrinkages in the top electrode of the ferroelectric capacitor.

SUMMARY OF THE INVENTION

It is, therefore, an object of the present invention to provide a method for manufacturing a ferroelectric random access memory (FeRAM) device with enhanced polarization, and improved short failure and leakage current characteristics by employing supplementary thermal treatment.

In accordance with one aspect of the present invention, there is provided a method for use with a FeRAM device, the method comprising the steps of a) preparing an active matrix provided with a transistor, diffusion regions, an isolation region, a bit line, a first insulating layer and a second insulating layer; b) forming a first conductive layer and then a dielectric layer on the active matrix; c) carrying out a rapid thermal annealing (RTA) for producing nuclei in the dielectric layer; d) forming a second conductive layer on top of the dielectric layer; e) carrying out a thermal annealing in a furnace; f) forming a capacitor Structure provided with a top electrode, a capacitor thin film and a bottom electrode by patterning the second conductive, the dielectric and the first conductive layers into a first predetermined configuration; g) carrying out a first recovery; h) forming a third insulating layer on the capacitor structure and the second insulating layer; i) patterning the third insulating layer to form a first opening and a second opening; and j) carrying out a second recovery.

BRIEF DESCRIPTION OF THE DRAWINGS

The above and other objects and features of the present invention will become apparent from the following description of the preferred embodiments given in conjunction with the accompanying drawings, in which:

FIGS. 2A to 2C are graphs of polarization, short failure ratio and leakage current of the FeRAM device of the present invention in comparison with those of the prior art.

DETAILED DESCRIPTION OF THE PREFERRED EMBODIMENTS

There are provided in FIGS. 1A to 1F cross sectional views setting forth a method for manufacturing a ferroelectric random access memory (FeRAM) device in accordance with a preferred embodiment of the present invention.

Figure 1A:
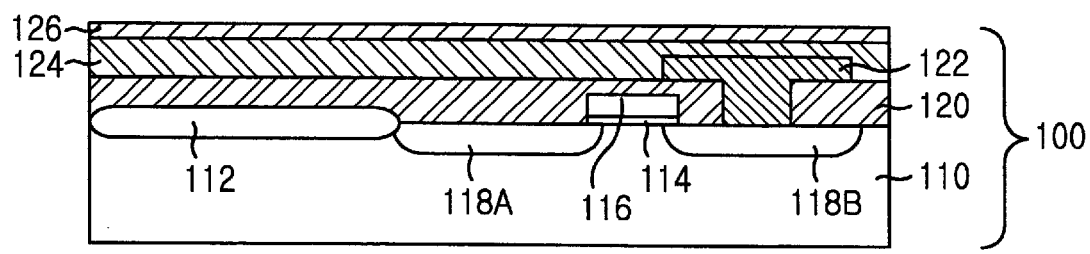
FIGS. 1A to 1F are cross sectional views setting forth a method for manufacturing a ferroelectric random access (FeRAM) device in accordance with a preferred embodiment of the present invention.

Referring to FIG. 1A, the process for manufacturing the FeRAM device begins with the preparation of an active matrix 100 including a semiconductor substrate 110, an isolation region 112, diffusion regions 118A, 118B, a gate oxide 114, a gate line 116, a first insulating layer 120, a bit line 122, a second insulating layer 124 and an oxide layer 126. One of the diffusion regions 118A serves as a source and the other diffusion region 118B serves as a drain. The first insulating layer 120 is made of a material such as boron-phosphor-silicate glass (BPSG) or the like. The bit line 122 is formed to be electrically connected to the drain of diffusion region 118B after patterning the first insulating layer 120 into a first predetermined configuration. Subsequently, the second insulating layer 124 and the oxide layer 126 are formed on the bit line 122 and the first insulating layer 120.

Figure 1B:
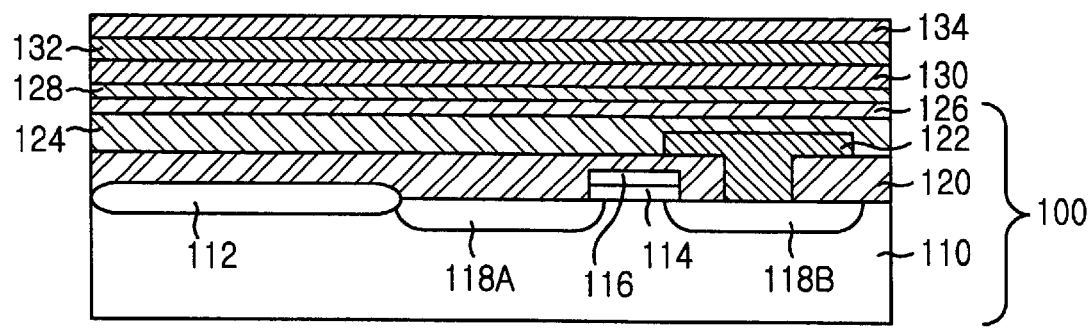

In a next step as shown in FIG. 1B, a buffer layer 128, which may be made of Ti or $TiO_x$, is formed on top of the oxide layer 126. A first conductive layer 130, a dielectric layer 132 and a second conductive layer 134 are then sequentially formed on top of the buffer layer 128. In the preferred embodiment, the conductive layers 130, 134, which may be made of platinum (Pt), platinum compound metal or the like, are each formed to a thickness of approximately 1,500 Å. The dielectric layer 132 can be made of a ferroelectric material such as lead ziroconate titanate (PZT), strontium bismuth tantalate (SBT), SBTN ($Sr_xBi_y(Ta_zNb_j)_2O_9$), or the like. The dielectric layer 132 is formed to a thickness of approximately 1,600 Å by using a method such as a spin coating, a chemical vapor deposition (CVD) or the like. Here, it is noted that a rapid thermal annealing (RTA) process is carried out at a temperature ranging from 700° C. to 750° C. for 20 to 60 seconds for producing nuclei in the dielectric layer 132 before forming the second conductive layer 134 on the ferroelectric dielectric layer 132. Further, a thermal annealing in a furnace is carried out at a temperature ranging from 775° C. to 825° C. for 30 to 90 minutes in oxygen rich ambient, for growing up grains.

Figure 1C:
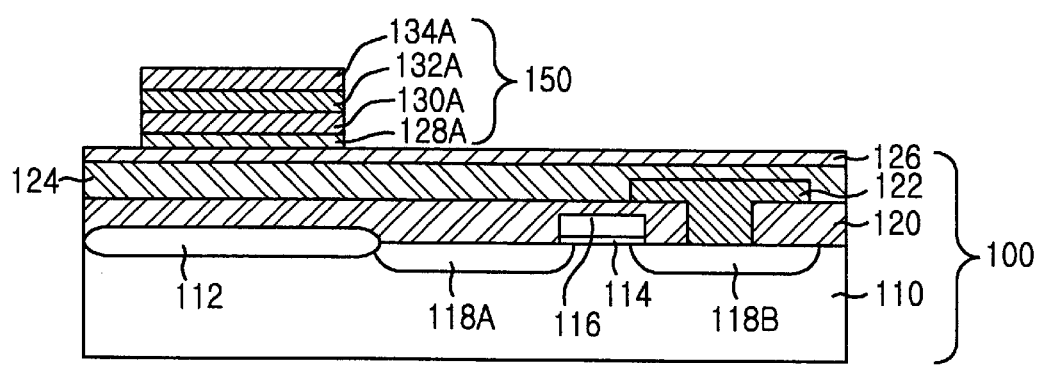

In an ensuing step as shown in FIG. 1C, the second conductive layer 134, the dielectric layer 132, the first conductive layer 130 and the buffer layer 128 are patterned into a second predetermined configuration, thereby obtaining a capacitor structure 150 including a top electrode 134A, a capacitor thin film 132A, a bottom electrode 130A and a buffer layer 128A. Then, a first recovery process is performed at a temperature ranging from 500° C. to 700° C. for 20 to 40 minutes to recover characteristics of the ferroelectric capacitor film 132A which has been degraded during patterning of the capacitor structure 150.

Figure 1D:
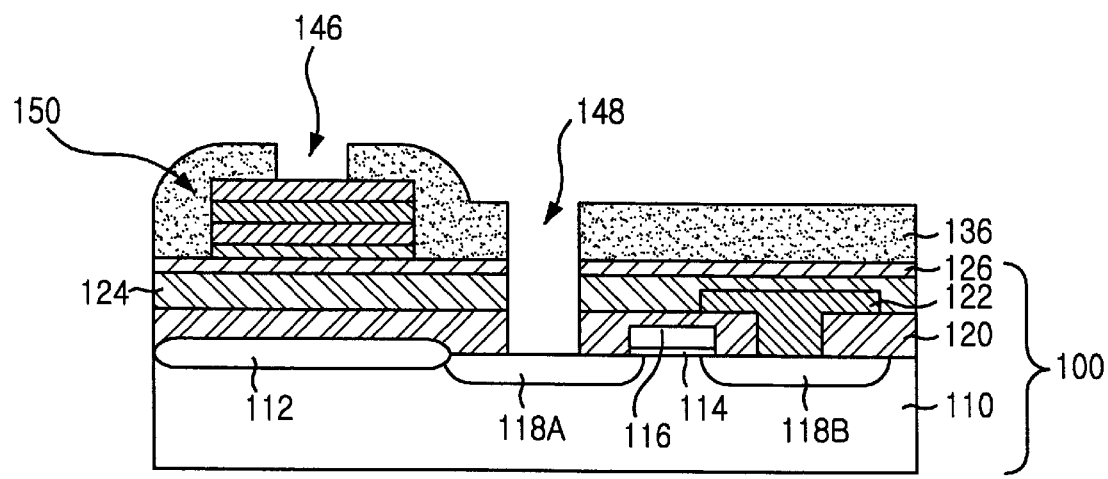

In a subsequent step as shown in FIG. 1D, a third insulating layer 136, which may be made of $SiO_2$, BPSG, $BPSG/SiO_2$ or the like, is formed to a thickness of approximately 5,000 Å on the capacitor structure 150 and the oxide layer 126. Then, an annealing process is carried out, for planarizing the surface of the third insulating layer 136, at approximately 800° C. for 20 to 40 minutes in a nitrogen rich ambient. Thereafter, the third insulating layer 136 is patterned into a third predetermined configuration, thereby obtaining a first opening 146 and a second opening 148. A second recovery process is then carried out for recovering the characteristics of the ferroelectric capacitor thin film 132A attacked by an etch step for forming the openings 146, 148.

Figure 1E:
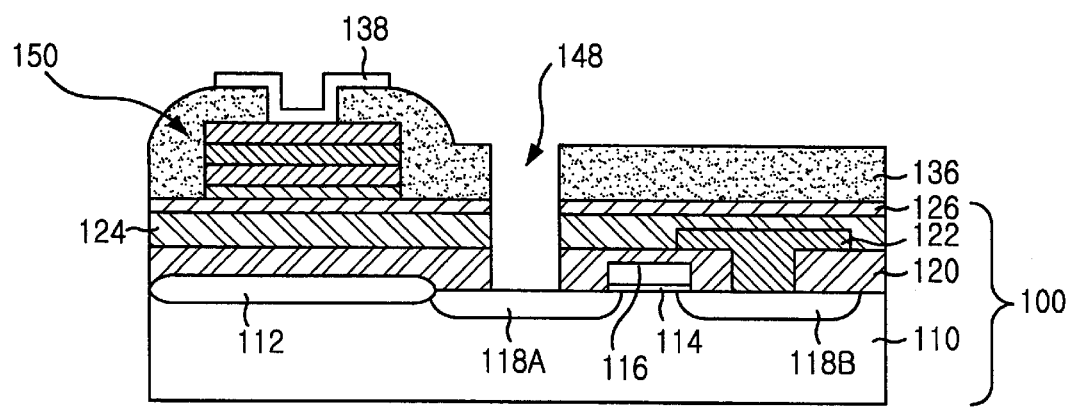

In a next step as shown in FIG. 1E, a first diffusion barrier layer 138 is formed on the top electrode 134A in the first opening 146, for inhibiting an inter-diffusion of silicon atoms along grain boundaries of the bottom electrode, which may be Pt. The first diffusion barrier layer 138 is made of a material such as titanium nitride (TiN), iridium/iridium oxide ($Ir/IrO_x$) or the like.

Figure 1F:
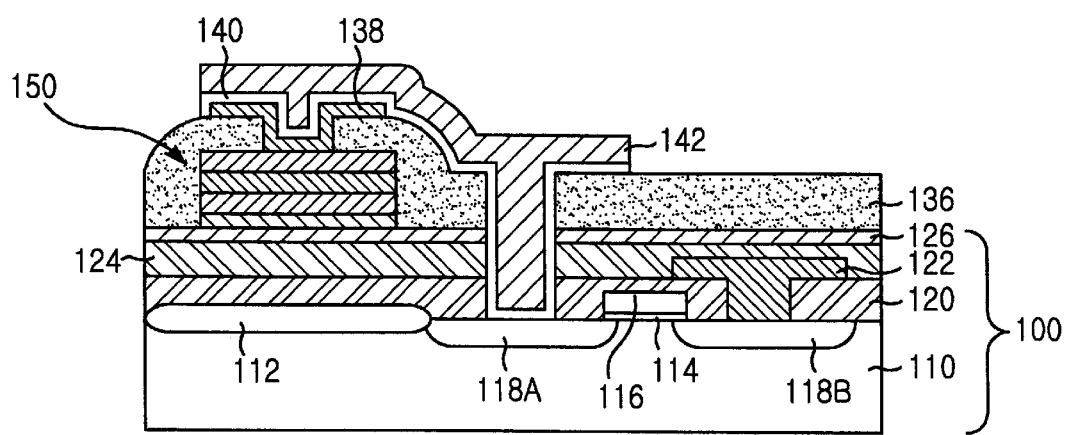

As shown in FIG. 1F, a hydrogen diffusion barrier layer 140 and a third conductive layer 142 are then formed on the entire surface, wherein the hydrogen barrier layer 140 is made of TiN/Ti and the third conductive layer 142 is made of aluminum (Al) in the embodiment. The third conductive layer 142 and the hydrogen barrier layer 140 are patterned into a fourth predetermined configuration, thereby obtaining a local interconnection to electrically connect the source of diffusion region 118A and the top electrode 134A.

Figure 2B:
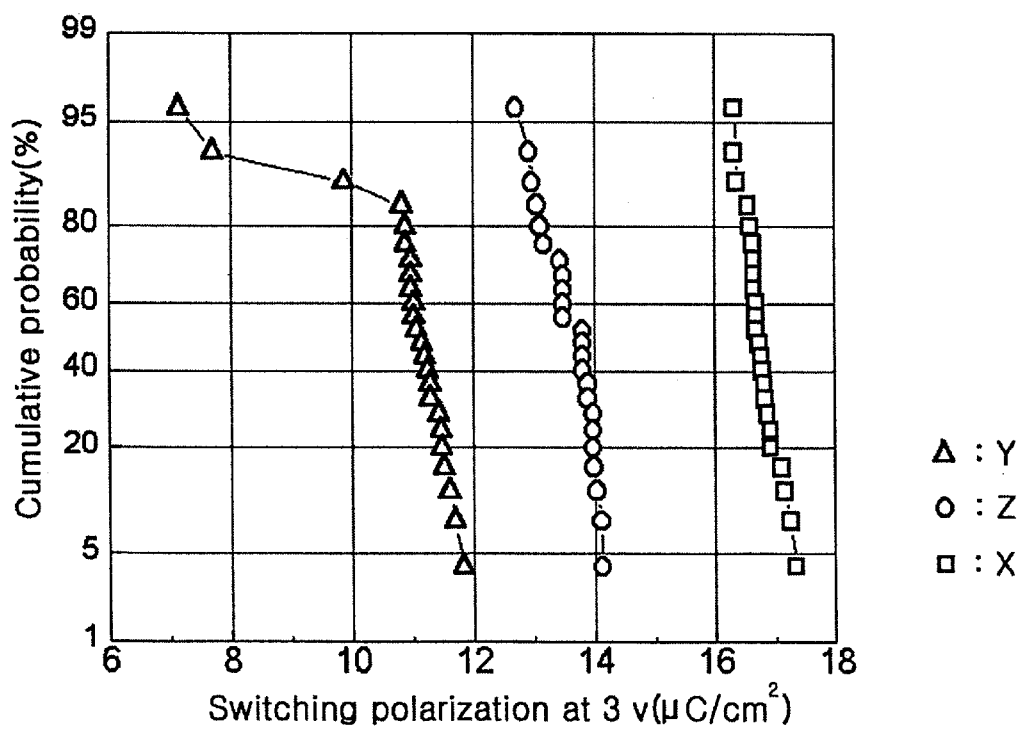
Figure 2C:
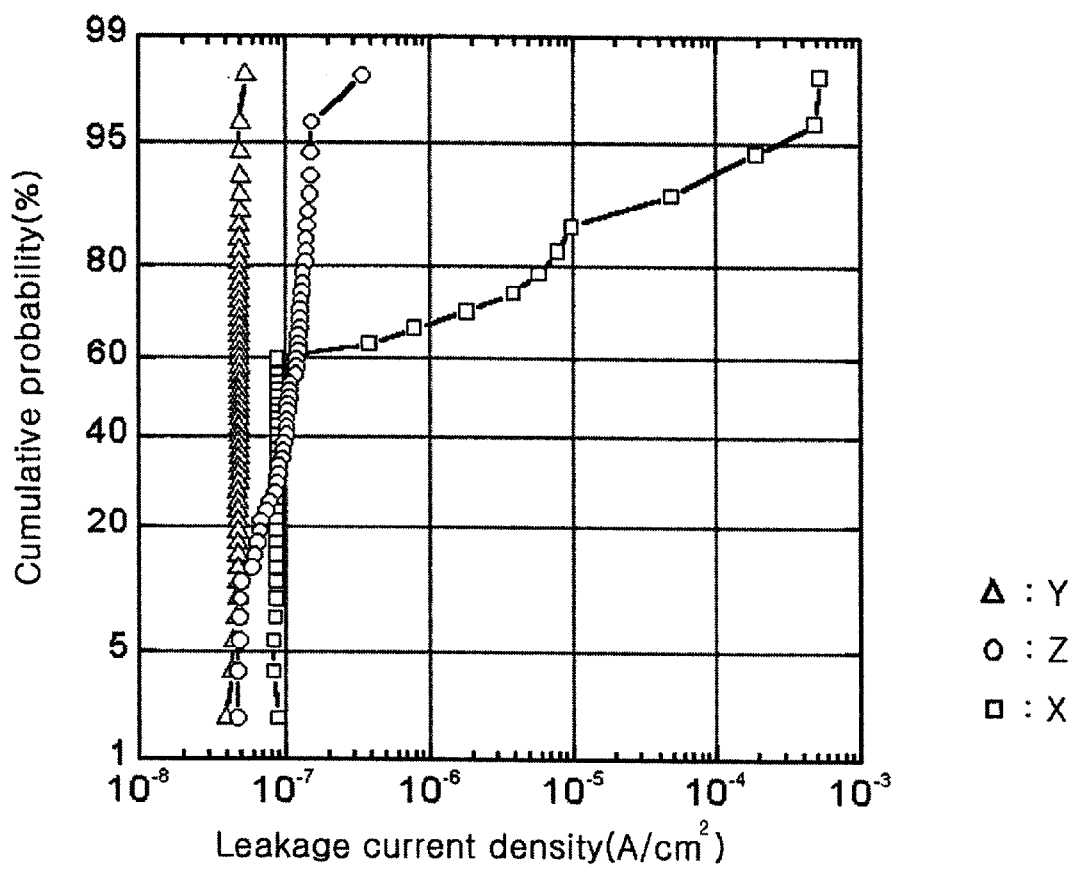

Referring to FIGS. 2A to 2C, there are shown graphs setting forth short failure, polarization, and leakage current characteristics for the inventive FeRAM device in comparison with those of conventional methods. Here, the "X" designator represents a first FeRAM device manufactured by a first conventional method, wherein the manufacturing steps have been carried out by RTA process; thermal annealing in the furnace; and formation of the top electrode. The "Y" designator represents a second FeRAM device manufactured by a second conventional method, wherein the manufacturing steps have been carried out by RTA process; formation of the top electrode; and thermal annealing in the furnace. The "Z" designator represents a third device manufactured by the inventive method.

From the results of these graphs, the method "X" represents a strong polarization characteristic but weak short failure and leakage current characteristics. By contrast, the method "Y" has good properties for the short failure and the leakage current, but has the drawback of a low polarization value. However, the inventive method "Z" provides a high polarization value close to that of the method "X", along with enhanced properties for the short failure ratio and the leakage current which are comparable to the results achieved with method "Y". That is, the inventive method shows enhanced properties for polarization, the short failure ratio and the leakage current.

While the present invention has been described with respect to the particular embodiments, it will be apparent to those skilled in the art that various changes and modifications may be made without departing from the scope of the invention as defined in the following claims.

What is claimed is:

1. A method for manufacturing a ferroelectric random access memory (FeRAM) device, the method comprising the steps of:
   a) preparing an active matrix provided with a transistor, diffusion regions, an isolation region, a bit line, a first insulating layer and a second insulating layer;
   b) forming a first conductive layer and then a dielectric layer on the active matrix;
   c) carrying out a rapid thermal annealing (RTA) for producing nuclei in the dielectric layer;
   d) forming a second conductive layer on top of the dielectric layer, thereby forming a resulting structure;
   e) subsequently carrying out a thermal annealing to the resulting structure in a furnace;
   f) forming a capacitor structure provided with a top electrode, a capacitor thin film and a bottom electrode by patterning the second conductive layer, the dielectric layer and the first conductive layer into a first predetermined configuration;
   g) carrying out a first recovery;
   h) forming a third insulating layer on the capacitor structure and the second insulating layer;
   i) patterning the third insulating layer to form a first opening and a second opening; and
   j) carrying out a second recovery.

2. The method as recited in claim 1, wherein the dielectric layer is made of a material selected from a group consisting of SBT ((Sr,Bi)Ta$_2$O$_9$), SBTN (Sr$_x$Bi$_y$(Ta$_i$Nb$_j$)$_2$O$_9$) and lead zirconate titanate (PZT).

3. The method as recited in claim 1, wherein the step c) is carried out at a temperature ranging from approximately 700° C. to approximately 800° C. for approximately 20 seconds to approximately 60 seconds in an oxygen rich ambient.

4. The method as recited in claim 1, wherein the step e) is carried out at a temperature ranging from approximately 755° C. to approximately 825° C. for approximately 30 minutes to approximately 90 minutes in an oxygen rich ambient.

5. The method as recited in claim 1, wherein the steps g) and j) are carried out at a temperature ranging from approximately 500° C. to approximately 700° C. for approximately 20 minutes to approximately 40 minutes in an oxygen rich ambient.

6. The method as recited in claim 1, after the step h), further comprising the step of annealing the device at a temperature of approximately 800° C. for approximately 20 minutes to approximately 40 minutes in a nitrogen rich ambient for planarizing the third insulating layer.

7. The method as recited in claim 1, wherein the first, second and third insulating layers are made of a material selected from a group consisting of silicon oxide (SiO$_2$), boron-phosphor-silicate glass (BPSG) and a combination thereof.

8. The method as recited in claim 1, after the step j), further comprising the steps of:
   k) forming a first diffusion barrier layer on the top electrode in the first opening;
   l) forming a second diffusion barrier layer on the first diffusion barrier layer, the third insulating layer and the second opening; and
   m) forming a third conductive layer on the second diffusion layer and patterning the third conductive layer and the second diffusion barrier into a second predetermined configuration to obtain a local interconnection.

9. The method as recited in claim 8, wherein the first diffusion barrier layer is made of a material selected from a group consisting of titanium nitride (TiN) and iridium/iridium oxide (Ir/IrO$_x$).

10. The method as recited in claim 8, wherein the second diffusion barrier layer is made of TiN/Ti.

* * * * *